United States Patent
Rowland et al.

(10) Patent No.: US 10,097,153 B1
(45) Date of Patent: Oct. 9, 2018

(54) BRIDGE-T REFLECTIONLESS BANDSTOP FILTER

(71) Applicant: SPAWAR Systems Center Pacific, San Diego, CA (US)

(72) Inventors: Jason F. Rowland, San Diego, CA (US); Jia-Chi S. Chieh, San Diego, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 105 days.

(21) Appl. No.: 15/455,299

(22) Filed: Mar. 10, 2017

(51) Int. Cl.
*H03H 7/12* (2006.01)
*H03H 7/01* (2006.01)
*H03H 7/07* (2006.01)

(52) U.S. Cl.
CPC ............ *H03H 7/12* (2013.01); *H03H 7/0115* (2013.01); *H03H 7/07* (2013.01); *H03H 2007/013* (2013.01)

(58) Field of Classification Search
CPC .......... H03H 7/12; H03H 7/0115; H03H 7/07; H03H 2007/013; H03H 7/0123; H03H 7/01
USPC ................. 333/138, 139, 172, 175, 176, 185
See application file for complete search history.

(56) References Cited

U.S. PATENT DOCUMENTS

| | | | |
|---|---|---|---|
| 5,157,362 A | 10/1992 | Zelenz | |
| 6,842,086 B1 | 1/2005 | Zennamo, Jr. | |
| 7,323,955 B2 | 1/2008 | Jachowski | |
| 8,013,690 B2 | 9/2011 | Miyashiro | |
| 8,305,164 B1 | 11/2012 | Jachowski | |
| 8,390,745 B2 | 3/2013 | Robert et al. | |
| 8,981,873 B2 * | 3/2015 | Zhang | H03H 7/0153 333/139 |

OTHER PUBLICATIONS

Jachowski, "Passive enhancement of resonator Q in microwave notch filters," IEEE MTT-S In. Microw. Symp. Dig., 2004, pp. 1315-1318.
Jachowski, "Compact frequency-agile, absorptive bandstop filters," IEEE MTT-S Micro. Symp. Dig. 2005, pp. 513-516.
Guyette et al., "Perfectly-matched bandstop filters using lossy resonators" 2005 IEEE MTT-S Int. Microwave Symp. Dig., Jun. 2005.

(Continued)

*Primary Examiner* — Rakesh Patel
*Assistant Examiner* — Jorge Salazar, Jr.
(74) *Attorney, Agent, or Firm* — SPAWAR Systems Center Pacific; Kyle Eppele

(57) ABSTRACT

A bandstop filter is provided that includes an input port, a series bandpass resonator, a first capacitor, a bandstop resonator, a second capacitor and an output port. The combination of the first capacitor, the bandstop resonator and the second capacitor comprises a bandstop impedance magnitude and a bandstop impedance phase. The bandpass resonator impedance magnitude is substantially equal to the bandstop impedance magnitude. The bandpass resonator impedance phase is substantially 180° out of phase with the bandstop impedance phase. The series bandpass resonator, the first capacitor, the bandstop resonator and the second capacitor operate as a band stop for a predetermined frequency within the frequency band.

20 Claims, 7 Drawing Sheets

(56) References Cited

OTHER PUBLICATIONS

Jachowski, "Tunable lumped-element notch filter with constant bandwidth," IEEE Int Wireless Inf. Technol. Syst. Conf. 2010, pp. 1-4.
Lee et al., "Octave tunable lumped-element notch filter with resonator-Q-independent zero coefficient," IEEE MTT-S Int. Microw. Symp. Dig., 2014 pp. 1-4.
Morgan et al., "Theoretical and experimental study of a new class of reflective loss filter," IEEE Trans. Microw. Theory Tech., vol. 59, nol. 5. pp. 1214-1221, May 2011.
Lee et al., "Lumped-element realization of absorptive bandstop filter with anomalously high spectral isolation," IEEE TMTT, vol. 60, No. 8, pp. 2424-2430, Aug. 2012.
Kim et al., "RF CMOS integrated on-chip tunable absorptive bandstop filter using Qtunable resonators," IEEE TED, vol. 60, No. 5, pp. 1730-1737, May 2013.

\* cited by examiner

US 10,097,153 B1

BRIDGE-T REFLECTIONLESS BANDSTOP FILTER

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 3600, San Diego, Calif., 92152; telephone (619) 553-5118; email: ssc_pac_t2@navy.mil. Reference Navy Case No. 103,826.

BACKGROUND OF THE INVENTION

The present invention generally relates to bandstop filters.

Frequency tunable bandstop filters are widely used to remove undesirable signals. Most bandstop filters are reflection type filters, meaning that at the frequency where the filter rejects a signal, that rejected signal is reflected back to the input. This is undesirable for many reasons. For example, consider a microwave or radio frequency receiver that receives a signal through a RF port.

If the receiver utilizes a frequency mixer it most likely uses a bandstop filter to reject unwanted signals. When the rejected signal is reflected by the bandstop filter, it may leak into the RF port. Once the rejected signal leaks back to the RF port, it may be remixed into the input signal, which is known as self-mixing and is very undesirable across most applications.

Recently, reflection-less or absorptive bandstop filters have been proposed which overcome the basic limitation of reflection type filters. Through the design of lossy resonators, absorptive bandstop filters can achieve a theoretically infinite amount of attenuation.

The current state of the art absorptive filters are acceptable for low frequency applications, but for high frequency applications, realization is difficult due to the parasitic and self-resonance effects from the large number of hardware elements required. For example, U.S. Pat. No. 7,323,955 to Jachowski and U.S. Pat. No. 8,981,873 to Zhang et al., each disclose a narrow-band absorptive bandstop filter that uses a plurality of inductors to generate a phase shift for destructive interference. The main drawback of these designs, however, is that as the quality factor and operating frequency changes, the values of the resonators change with exception to the lossy resistors. In other words, the only way to increase the Q is to increase the values of the inductors used. This can be prohibitive at higher RF frequencies.

Accordingly, for at least the foregoing reasons there exists a need for an absorptive bandstop filter that can have an improved Q without prohibitively large inductors at higher RF frequencies.

SUMMARY OF THE INVENTION

An aspect of the present invention is drawn to a bandstop filter that includes an input port, a series bandpass resonator, a first capacitor, a bandstop resonator, a second capacitor and an output port. The input port receives an oscillating signal within a frequency band. The series bandpass resonator is in electrical connection with said input port and the output port. The first capacitor is electrically connected with the input port and the series bandpass resonator. The bandstop resonator is electrically connected with the first capacitor and ground. The second capacitor is electrically connected with the bandstop resonator and the output port. The series bandpass resonator comprises a first bandpass impedance element, a bandpass capacitor and a second bandpass impedance element arranged in series between the input port and the output port. The bandstop resonator comprises a first bandstop impedance element, a bandstop capacitor and a second bandstop impedance element arranged in series between the first capacitor and ground. The series bandpass resonator comprises a bandpass resonator impedance magnitude and a bandpass impedance phase. The combination of the first capacitor, the bandstop resonator and the second capacitor comprises a bandstop impedance magnitude and a bandstop impedance phase. The bandpass resonator impedance magnitude is substantially equal to the bandstop impedance magnitude. The bandpass resonator impedance phase is substantially 180° out of phase with the bandstop impedance phase. The series bandpass resonator, the first capacitor, the bandstop resonator and the second capacitor operate as a band stop for a predetermined frequency within the frequency band.

BRIEF DESCRIPTION OF THE DRAWINGS

The accompanying drawings, which are incorporated in and form a part of the specification, illustrate example embodiments and, together with the description, serve to explain the principles of the invention. In the drawings.

DETAILED DESCRIPTION OF THE EMBODIMENTS

Aspects of the present invention are drawn to a bandstop filter that uses two resonators to generate two signals that are 180° degrees out of phase with each other within a given frequency band so as to destructively interfere with one another at the given frequency band.

In accordance with a first aspect of the present invention, an input signal is provided to a series bandpass resonator and a bandstop resonator, where each resonator has a capacitor.

The series bandpass resonator passes the input signal to an output port, whereas the bandstop resonator applies a phase delay to a portion of input signal within a predetermined frequency band that is to be attenuated.

The delay in the signal in the frequency range to be attenuated establishes a 180° phase shift between the signal passed to the output port by the series bandpass resonator and the bandstop resonator. The 180° phase shift between the two signals results in destructive interference between the two signals at the predetermined frequency band that is to be attenuated. This allowing for a high degree of attenuation, while maintaining signal integrity outside of the frequency band that is being attenuated.

Example systems in accordance with the first inventive aspect of the present invention will now be described with reference to FIGS. 1-6.

Figure 1:
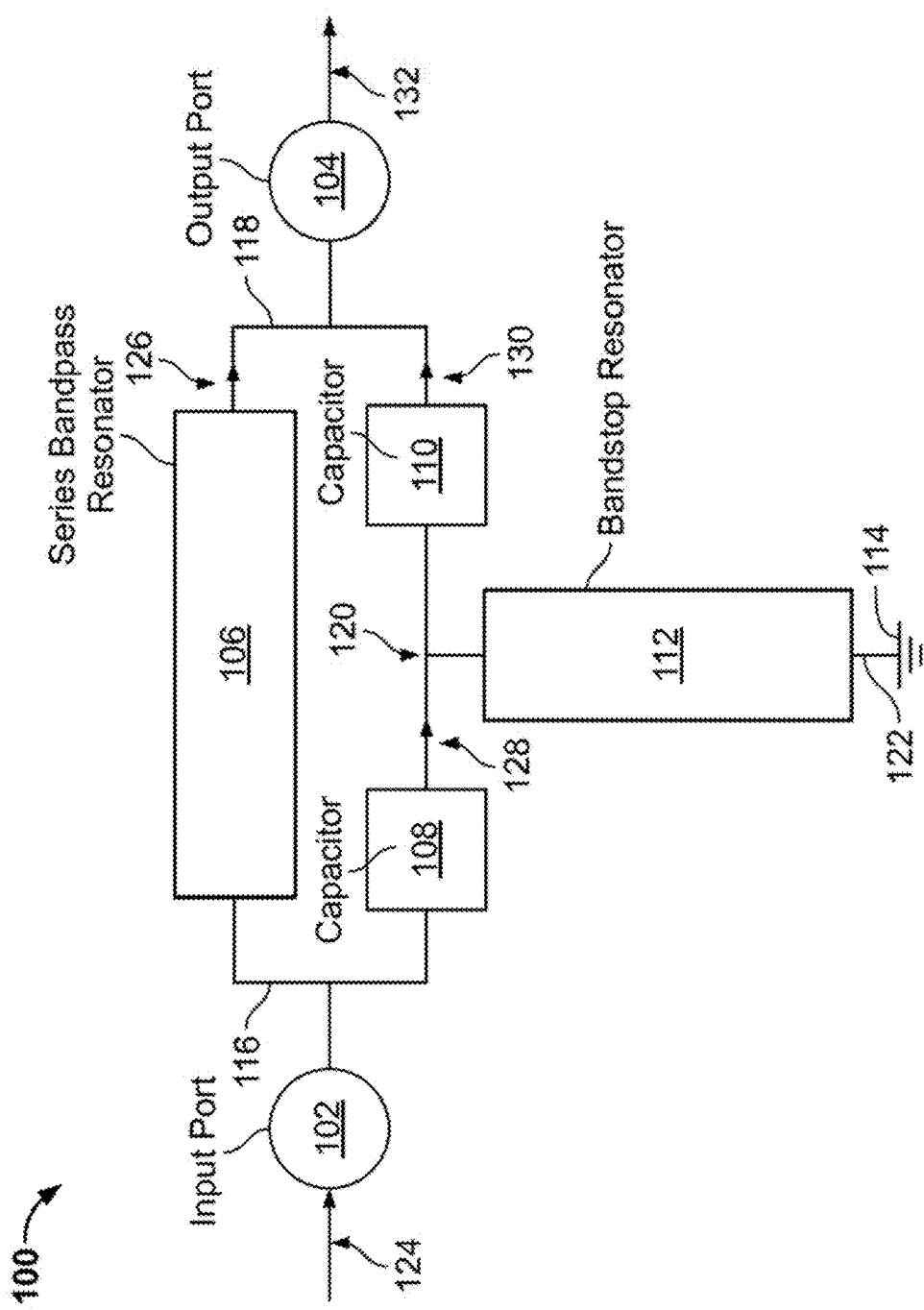
FIG. 1 illustrates a block diagram of a bandstop filter in accordance with aspects of the present invention.

FIG. 1 illustrates a block diagram of a bandstop filter 100 in accordance with aspects of the present invention.

As illustrated in the figure, bandstop filter 100 includes an input port 102, an output port 104, a series bandpass resonator 106, a capacitor 108, a capacitor 110, a bandstop resonator 112, and a ground 114.

Input port 102 is arranged to receive input signal 124. Input port 102 provides input signal 124 to series bandpass resonator 106 and capacitor 108, via line 116.

Output port 104 is arranged to receive signal 126 from series bandpass resonator 106, via line 118, and to receive signal 130 from bandstop resonator 112, via capacitor 110 and line 118. Output port 104 transmits the combination of signal 126 and signal 130 as output signal 132.

Series bandpass resonator 106 is arranged in series between input port 102 and output port 104. Series bandpass resonator 106 is arranged to receive input signal 124 provided by input port 104, via line 116. Series bandpass resonator 106 generates signal 126 by adding a phase shift to input signal 124. Series bandpass resonator 106 further transmits signal 126 to output port 104, via line 118.

Series bandpass resonator 106 generates signal 126 by oscillating near the frequency to be attenuated by bandstop filter 100. Series bandpass resonator 106 oscillates in a manner such that its phase shift from input signal 124 is as close to 0° as possible. Input signal 124 may not be able to be provided to output port 104 without any modification due to design constraints imposed by the required resonance and phase shifting of bandstop filter 112. Determining and implementing the phase shift of signal 126 by series bandpass resonator 106 will be further described in FIGS. 2-6.

Capacitor 108 is arranged to receive input signal 124 provided by input port 102, via line 116. Capacitor 108 provides input signal 124 as signal 128 to both capacitor 110 and bandstop resonator 112, via line 120.

Capacitor 110 is arranged to receive input signal 124 as signal 128 provided by capacitor 108, via line 120. Capacitor 110 provides signal 128 as signal 130 to output port 104, via line 118.

The combination of capacitor 108 and capacitor 110 in series act as an all-pass filter between series bandpass resonator 106 and bandstop resonator 112. In this manner, capacitor 108 and capacitor 110 are able to apply a phase shift relative to signal 126 in the attenuation frequency band of signal 130.

Bandstop resonator 112 is arranged in series between capacitor 108 and ground 114. Bandstop resonator 112 is arranged to receive signal 128 provided by capacitor 108, via line 120. Bandstop resonator 112 operates with capacitor 108 and capacitor 110 to generate a phase shift in signal 130 that is output from capacitor 110.

The use of bandstop resonator 112 in conjunction with the all-pass filter created by capacitor 108 and capacitor 110 work together as an impedance inverter. In this manner, signal 130 that is provided to output 104 by capacitor 110 is the same as signal 126 generated by bandpass resonator 112 outside of the attenuation frequency band. Near the attenuation frequency band, signal 130 is 180° out of phase with signal 126. Determining and implementing the phase shift of signal 130 by bandstop resonator 106 will be further described in FIGS. 2-6.

Ground 114 is arranged to provide a ground to bandstop resonator 112, via line 122.

In operation, suppose that bandstop filter 100 is supposed to attenuate input signal 124 at 4.2 GHz and that input signal 124 is an oscillating signal and has a frequency range of 0 GHz to 8 GHz.

Additionally, suppose that bandpass resonator 106 and bandstop resonator 112 have been designed to resonate near the attenuation frequency of 4.2 GHz. The design and implementation of bandpass resonator 106 and bandstop resonator 112 in order to achieve resonance at the attenuation frequency will be further described in FIGS. 2-6.

Input signal 124 is provided from an external source to input port 102 in order to be attenuated at 4.2 GHz. Once input signal 124 is received, input port 102 provides input signal 124 to bandpass resonator 106 and capacitor 108, via line 116.

Bandpass resonator 106 receives input signal 124 and applies a phase shift in order to generate signal 126. Suppose that in this example, the phase shift of signal 126 is 0° from the phase of input signal 124.

Simultaneously, capacitor 108 receives input signal 124 from input port 104, which it then provides to capacitor 110 and bandstop resonator 112 as signal 128, via line 120. The portion of signal 128 that is not within the attenuation frequency band passes through capacitor 110 with a phase shift of 0°. Since bandstop resonator 112 is oscillating at a frequency of 4.2 GHz, capacitor 108 and capacitor 110 act as a high pass filter that introduces a delay for the portion of the signal within the attenuation frequency band. In this manner, signal 130 provided by capacitor 110 to output port 104 has a 0° phase shift outside of the attenuation frequency band, and a phase shift of 180° inside of the attenuation frequency band.

At this time, output port 104 receives signal 126 and signal 130 which are combined in order to create output signal 132. Since there is no phase shift outside of the attenuation frequency band between signal 126 and signal 130, this portion of the signal remains the same as input signal 124. In the attenuation frequency band, signal 126 and signal 130 are 180° out of phase and these portions of the signals cancel each other out due to destructive interference. At this point, due to the destructive interference between signal 126 and signal 130, input signal 124 has been attenuated in the attenuation frequency band and is transmitted by output port 104 as output signal 132.

In this example embodiment, the resonant frequency of series bandpass resonator 106 and bandstop resonator 112 were already chosen in order to create a phase shift in the attenuation frequency band surrounding 4.2 GHz. In practice, the impedance of series bandpass resonator 106 and bandstop resonator 112 need to be parametrically determined in order to achieve attenuation within a given frequency band.

The determination of the impedances of series bandpass resonator 106 and bandstop resonator 112 will now be further described with additional reference to FIGS. 2-6.

Figure 2:
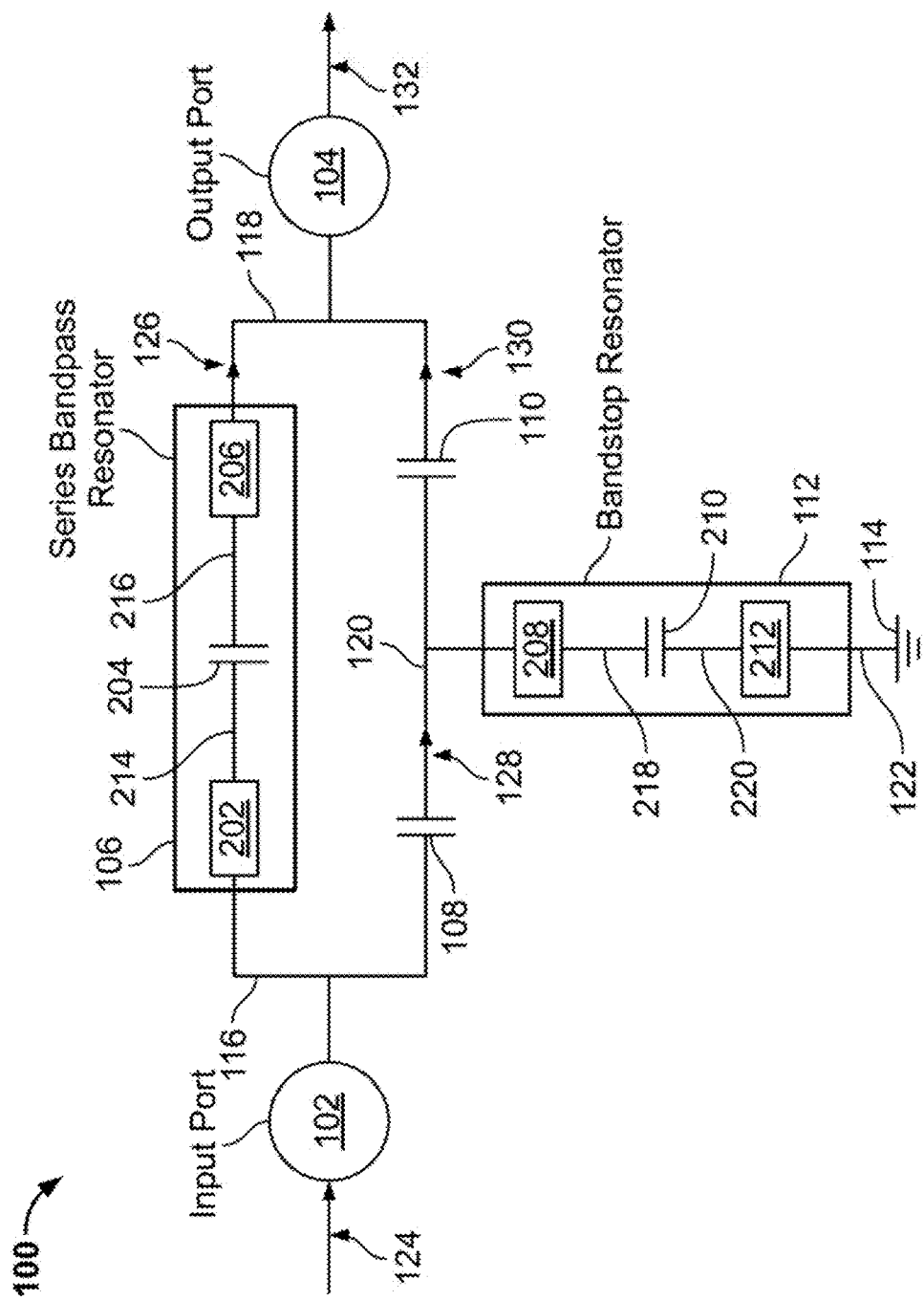
FIG. 2 illustrates a block diagram of a bandstop filter in accordance with aspects of the present invention.

FIG. 2 illustrates bandstop filter 100 of FIG. 1 in accordance with aspects of the present invention.

As illustrated in the figure, FIG. 2 contains all of the same elements of FIG. 1 with the exception that series bandpass resonator 106 and bandstop resonator 112 now have their internal components exposed for the purposes of this illustration. In this example, series bandpass resonator 106 includes an impedance element 202, a bandpass capacitor 204, and an impedance element 206. Bandstop resonator 112 additionally includes an impedance element 208, a bandstop capacitor 210, and an impedance element 212.

Impedance element 202 is arranged to receive input signal 124 provided by input port 104, via line 116. Impedance element 202 transmits input signal 124 to bandpass capacitor 204, via line 214. Impedance element 202 may be one of a plurality of known impedance elements, non-limiting examples of which include an inductor, a capacitor, a resistor, or a varactor. In this non-limiting example embodiment, impedance element 202 is an inductor.

Bandpass capacitor 204 is arranged to receive input signal 124 from impedance element 202, via line 214. Bandpass capacitor 204 provides input signal 124 to impedance element 206, via line 216.

Impedance element 206 is arranged to receive input signal 124 provided by bandpass capacitor 204, via line 214. Impedance element 206 transmits input signal 124 as signal 126 to output port 104, via line 118. Impedance element 206 may be one of a plurality of known impedance elements. In this non-limiting example embodiment, impedance element 206 is a resistor.

Impedance element 202, bandpass capacitor 204, and impedance element 206 are arranged in series in order to create series bandpass resonator 106, which is also an RLC circuit. An RLC circuit forms a harmonic oscillator for the input signal and resonates. Resonance occurs due to the collapsing magnetic field of the inductor generates an electrical current in its windings that charges the capacitor, and then the discharging capacitor provides an electrical current the builds the magnetic field in the inductor. The resonance between the inductor and capacitor occurs at a particular frequency that can be determined by the values used for inductance and capacitance. The resistor in the RLC circuit dampens the oscillation between the inductor and capacitor if it not continually driven by a source.

Impedance element 208 is arranged to receive signal 128 provided by capacitor 108, via line 120. Impedance element 208 transmits signal 128 to bandstop capacitor 210, via line 218. Impedance element 208 may be one of a plurality of known impedance elements. In this non-limiting example embodiment, impedance element 208 is an inductor.

Bandstop capacitor 210 is arranged to receive signal 128 from impedance element 208, via line 218. Bandstop capacitor 210 provides signal 128 to impedance element 212, via line 220.

Impedance element 212 is arranged to receive signal 128 provided by bandstop capacitor 210, via line 220. Impedance element 212 is connected to ground 114, via line 122. Impedance element 212 may be one of a plurality of known impedance elements. In this non-limiting example embodiment, impedance element 212 is a resistor.

Impedance element 208, bandstop capacitor 210, and impedance element 212 are arranged in series in order to create bandstop resonator 112, which is also an RLC circuit and similar in operation to that of series bandpass resonator 106 as described above.

As described above in FIG. 1, capacitor 108 and capacitor 110 are in series and operate together in order to function as a high pass filter to delay capacitor 110 from transmitting input signal 124 as signal 130 to output port 104. Signal 130 output by capacitor 110 is identical to signal 126 outside of the frequency attenuation band, but due to the resonance of bandstop resonator 112, the output of signal 130 within the attenuation frequency band is delayed. The delay can be adjusted by varying the values of capacitor 108 and capacitor 110.

For the discussion, let impedance element 202 be an inductor, let impedance element 206 be a resistor, let impedance element 208 be an inductor 208, and let impedance element 212 be a resistor.

In operation, suppose that bandstop filter 100 is supposed to attenuate input signal 124 at 5.3 GHz and that input signal 124 is an oscillating signal and has a frequency range of 0 GHz to 8 GHz. The operation of bandstop filter 100 in FIG. 2 is identical to the operation of bandstop filter 100 in FIG. 1. The difference between FIG. 1 and FIG. 2 is that in FIG. 1, it was assumed that bandpass resonator 106 and bandstop resonator 112 were resonating near the attenuation frequency without any acknowledgement of the inductance, capacitance, or resistance of their components.

In practice, the inductance, capacitance, and resistance of inductor 202, bandpass capacitor 204, resistor 206, inductor 208, bandstop capacitor 210, and resistor 212 need to be calculated in order to create a resonance in series bandpass resonator 106 and bandstop resonator 112 near the attenuation frequency.

The impedance Z-matrix for bandstop filter 100 is defined by equation (1) shown below.

$$Z = \begin{bmatrix} \frac{Z_1^2 + Z_1 Z_3}{2Z_1 + Z_3} + Z_2 & \frac{Z_1^2}{2Z_1 + Z_3} + Z_2 \\ \frac{Z_1^2}{2Z_1 + Z_3} + Z_2 & \frac{Z_1^2 + Z_1 Z_3}{2Z_1 + Z_3} + Z_2 \end{bmatrix}, \quad (1)$$

where $Z_1$ corresponds to the impedance of each of capacitors 108 and 110, $Z_2$ corresponds to the impedance of bandstop resonator 112, and $Z_3$ corresponds to the impedance of series bandpass resonator 106.

Using equation (1), the S-parameters of band stop filter 100 can be determined through a transformation of equation (1) as shown in equation (2) and equation (3), where $S_{21}$ is defined by equation (2) and $S_{11}$ is defined by equation (3) shown below.

$$S_{21} = \left[ \frac{2Z_{21}Z_0}{(Z_{11} + Z_0)(Z_{22} + Z_0) - Z_{12}Z_{21}} \right] \quad (2)$$

$$S_{11} = \left[ \frac{(Z_{11} - Z_0)(Z_{22} + Z_0) - Z_{12}Z_{21}}{(Z_{11} + Z_0)(Z_{22} + Z_0) - Z_{12}Z_{21}} \right] \quad (3)$$

Equation (2) represents the attenuation of an input signal within the attenuation band by bandstop filter 100. Equation (3) represents the transmission of an input signal outside of the attenuation band by bandstop filter 100.

In this example embodiment, bandstop filter 100 is to attenuate input signal 124 at an attenuation frequency of 5.3 GHz. To achieve a resonance in series bandpass filter 106 near 5.3 GHz, the inductance of inductor 202 is chosen to be 9.9 nanoHenry (nH) and the capacitance of capacitor 206 is chosen to be 0.095 picoFarad (pF), resulting in a resonant frequency of 5.3 GHz. Similarly, the inductance of inductor 208 is chosen to be 9.4 nH and the capacitance of bandstop capacitor 210 is chosen to be 0.095 pF, resulting in a resonant frequency of 5.18 GHz.

Since the two resonant frequencies are different, the capacitance of capacitor 108 and capacitor 110 can be chosen to add a delay. Using a capacitance of 4.7 pF for of capacitor 108 and capacitor 110 adds a delay to the resonant frequency between inductor 208 and bandstop capacitor 210, resulting in a final resonant frequency of 5.3 GHz.

At this time, the resistance values of resistor 206 and resistor 212 must be determined. The impedance of stopband filter 100 described by equation (1) and the S-parameter transfer functions described equation (2) and equation (3) are each high order polynomials. $Z_{11}$ and $Z_{21}$ are determined to have $4^{th}$ order polynomials and the $S_{21}$ and $S_{11}$ transfer functions are also high order polynomials exceeding $5^{th}$ order. Due to the high order of equation (1), equation (2), and equation (3) numerical methods and parametric simulations are suitable for determining the resistance values of resistor 206 and resistor 212.

In order to determine the optimum resistance values of resistor 206 and resistor 212 a simulation of bandstop filter 100 is created. Once created, the simulation is run for all of the potential resistance values of resistor 206 and resistor 212. The simulation then outputs results in the context of either equation (2) or equation (3), which can then be used to determine the values of resistor 206 and resistor 212.

Determining the resistance values of resistor 206 and resistor 212 through numerical simulations will now be further described with additional reference to FIGS. 3A-6.

Figure 3A:
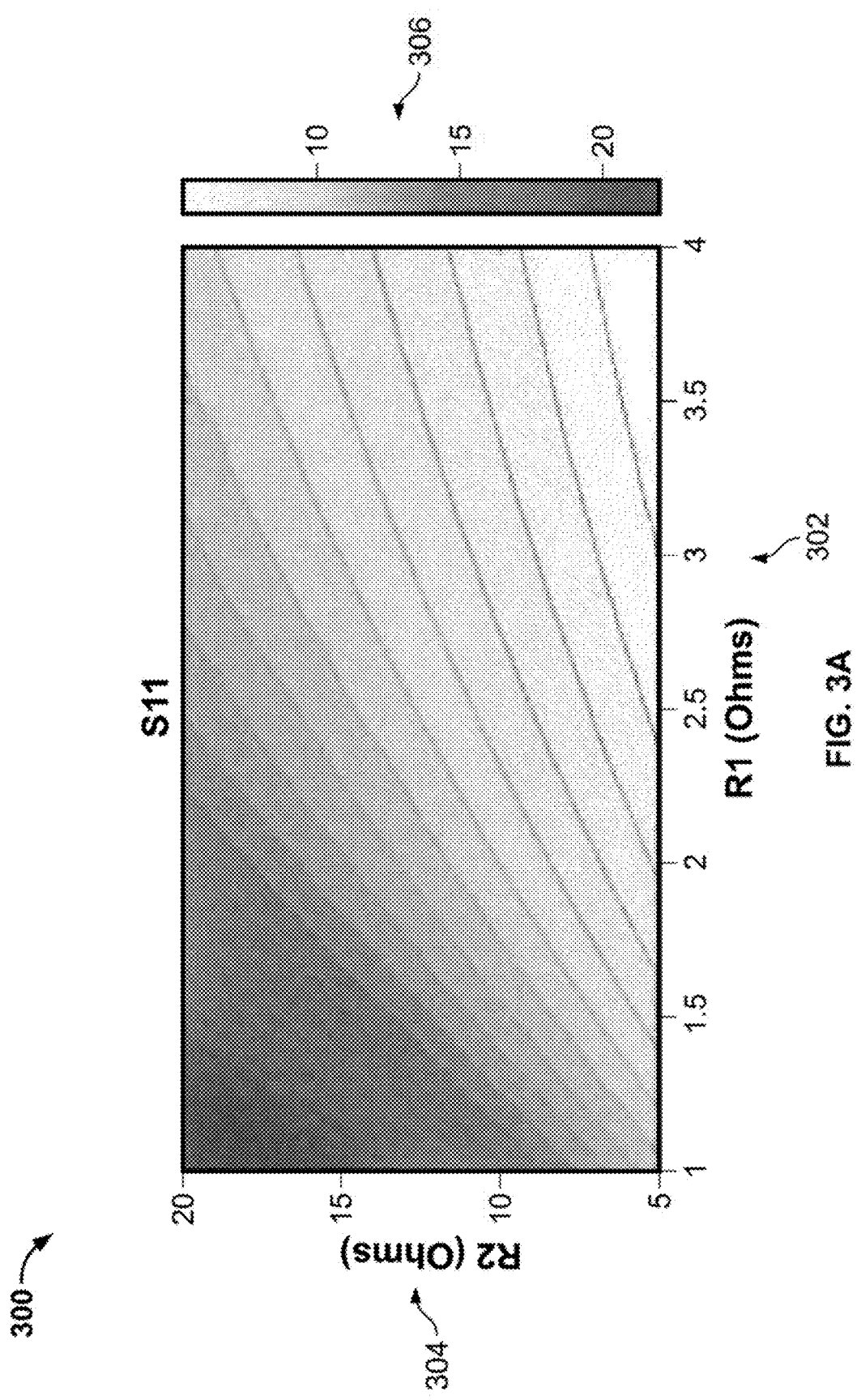
FIG. 3A illustrates a graph of the results of a parametric simulation of a bandstop filter in accordance with aspects of the present invention.

FIG. 3A illustrates a graph 300 of the results of a numerical simulation of bandstop filter 100 in regards to S-parameter $S_{11}$.

As illustrated in the figure, graph 300 includes an X-Axis 302, a Y-Axis 304, and an intensity legend 306.

X-Axis 302 represents the resistance of resistor 206 of FIG. 2 in ohms. Y-Axis 304 represents the resistance of resistor 212 of FIG. 2 in ohms. Intensity legend 306 represents the transmission insertion loss in decibels, for the corresponding resistance values of resistor 206 and resistor 212, where the lower the amount of insertion loss is better.

In operation, a numerical simulation of bandstop filter 100 is run for varying resistance values of resistor 206 and resistor 212. During the simulation, the resistance of resistor 206 is between 1 ohm and 4 ohms, and the resistance of resistor 212 is between 5 ohms and 20 ohms.

As seen in graph 300, when the resistance of resistor 206 is 4 ohms and the resistance of resistor 212 is 5 ohms, there is almost no insertion loss. But, when the resistance of resistor 206 is 1 ohm and the resistance of resistor 212 is 20 ohms, there is almost −20 decibels of insertion loss, which would be the optimum resistance values to use in the bandstop filter 100 to achieve minimum insertion loss of an input signal.

Figure 3B:
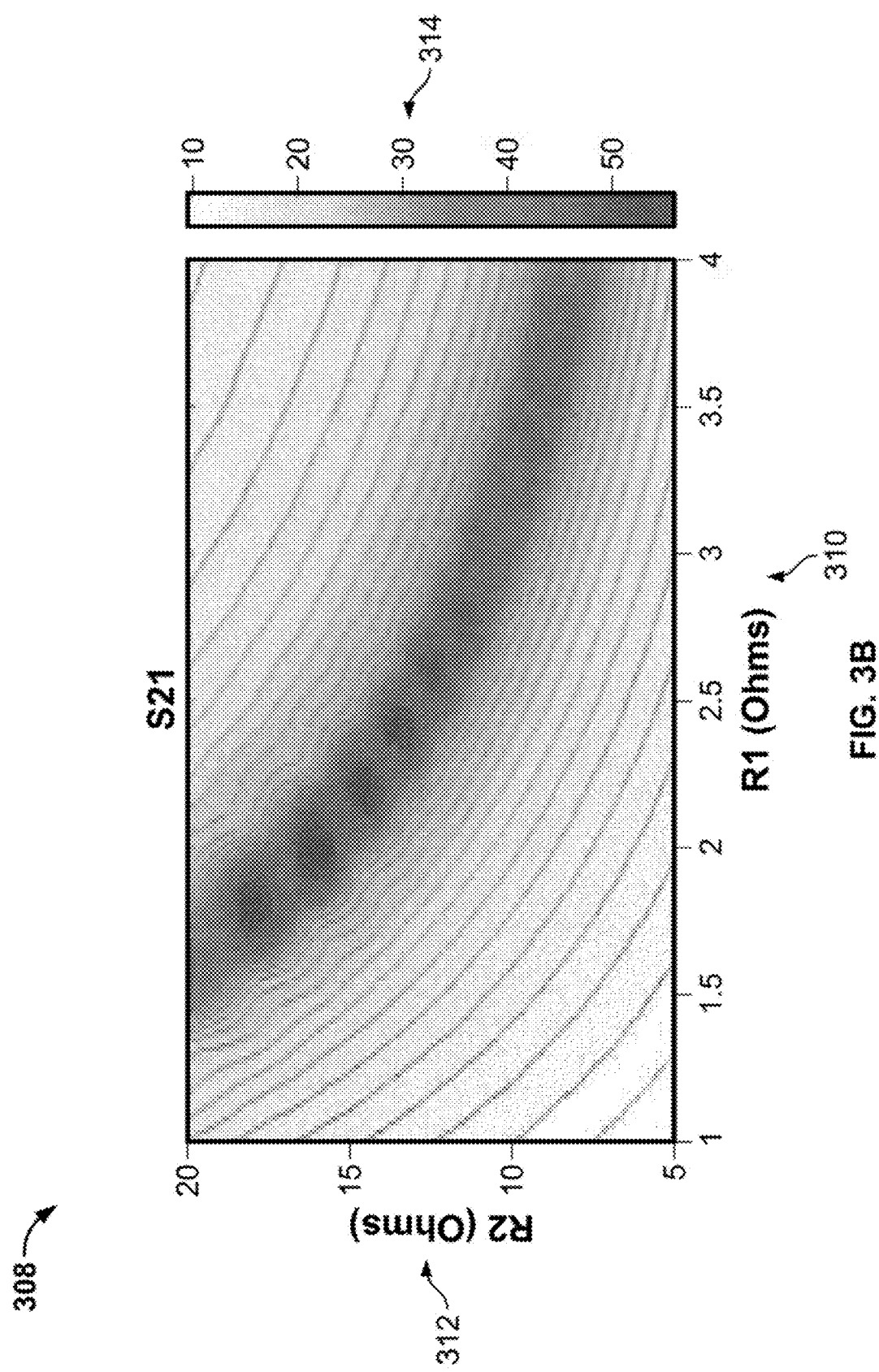
FIG. 3B illustrates a graph of the results of a parametric simulation of a bandstop filter in accordance with aspects of the present invention.

FIG. 3B illustrates a graph 308 of the results of a numerical simulation of bandstop filter 100 in regards to S-parameter $S_{21}$.

As illustrated in the figure, graph 308 includes an X-Axis 310, a Y-Axis 312, and an intensity legend 314.

X-Axis 310 represents the resistance of resistor 206 of FIG. 2 in ohms. Y-Axis 312 represents the resistance of resistor 212 of FIG. 2 in ohms. Intensity legend 314 represents the attenuation of an input signal within the attenuation band by bandstop filter 100, for the corresponding resistance values of resistor 206 and resistor 212, where the lower the amount of insertion loss is better.

In operation, a numerical simulation of bandstop filter 100 is run for varying resistance values of resistor 206 and resistor 212. During the simulation, the resistance of resistor 206 is between 1 ohm and 4 ohms, and the resistance of resistor 212 is between 5 ohms and 20 ohms.

As seen in graph 308, when the resistance of resistor 206 is 1 ohm and the resistance of resistor 212 is 5 ohms, there is almost no attenuation of the input signal. But, when the resistance of resistor 206 is 2 ohms and the resistance of resistor 212 is 17 ohms, there is an attenuation of almost −50 decibels, which would be the optimum resistance values to use in the bandstop filter 100 to achieve maximum attenuation of an input signal.

Referring back to FIG. 2, as described above in FIGS. 3A-B, the best values for the resistance of resistor 206 and resistor 212 are different depending on whether optimal insertion loss or attenuation is desired. To determine the best values for resistor 206 and resistor 212, the values need to be chosen where there is a maximum amount of attenuation in both graph 300 of FIG. 3A and graph 308 of FIG. 3B.

In this example embodiment, these values are 2.25 ohms for the resistance of resistor 206 and 17.7 ohms for the resistance of 212, which give approximately −15 decibels of insertion loss and −50 decibels of attenuation. Using these resistance values, a high amount of rejection can be achieved while maintaining signal integrity.

A comparison between measured and simulated results of bandstop filter 100 will now be discussed with additional reference to FIG. 4.

Figure 4:
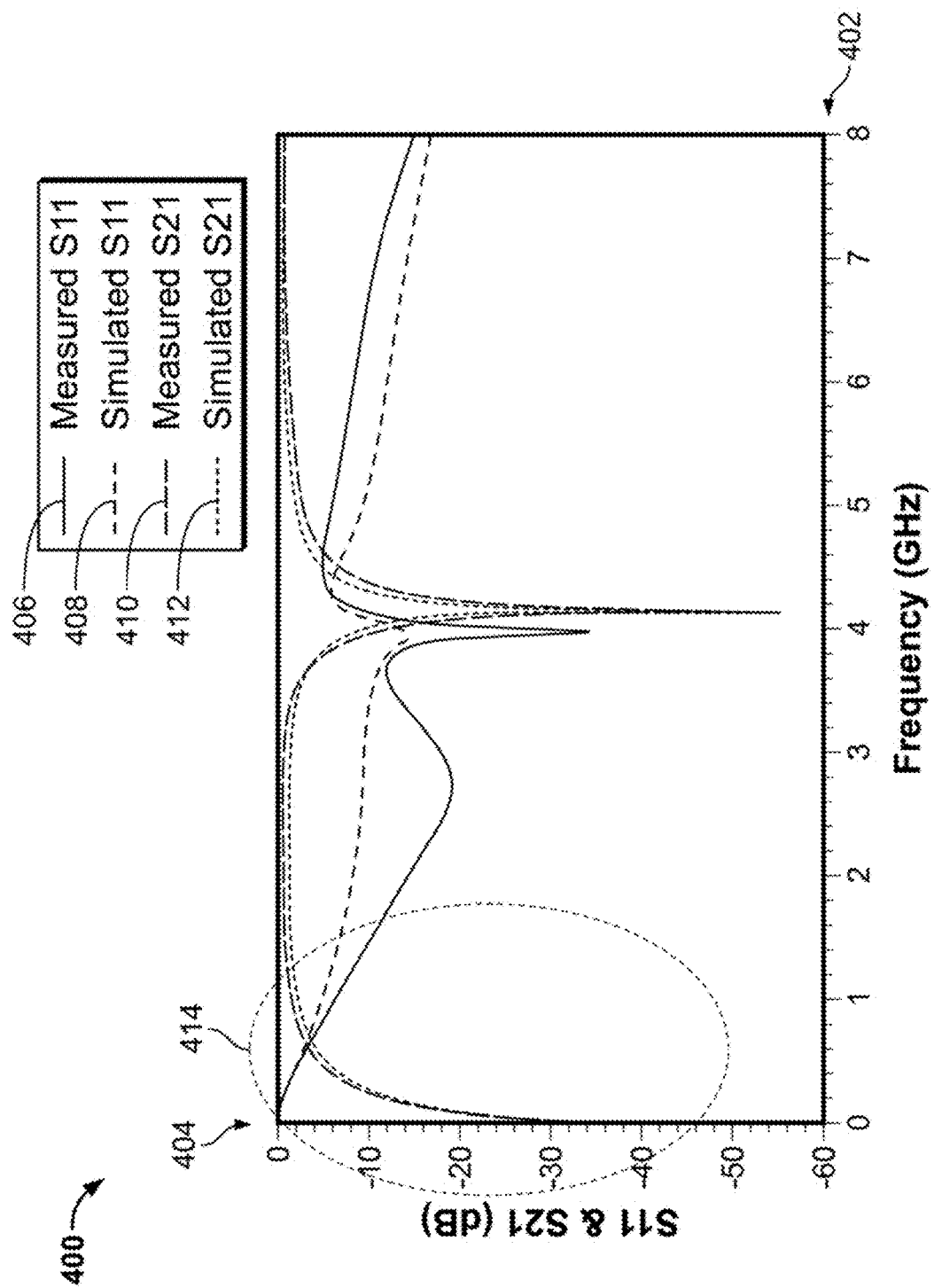
FIG. 4 illustrates a graph of simulated and measured results of a bandstop filter in accordance with aspects of the present invention.

FIG. 4 illustrates a graph 400 comparing the measured and simulated results bandstop filter 100.

As shown in the figure, graph 400 includes an X-Axis 402, a Y-Axis 404, a line 406, a line 408, a line 410, and a line 412.

X-Axis 402 represents frequency in GHz. Y-Axis 404 represents intensity in decibels. Line 406 represents the measured insertion loss ($S_{11}$) of bandstop filter 100. Line 408 represents the simulated insertion loss ($S_{11}$) of bandstop filter 100. Line 410 represents the measured signal attenuation ($S_{21}$) of bandstop filter 100. Line 412 represents the simulated signal attenuation ($S_{21}$) of bandstop filter 100.

In operation, when comparing line 406 and line 408, it can be seen that there is a high correlation between the measured and simulated insertion loss of an input signal by bandstop filter 100. Line 410 and line 412 also have a high degree of correlation; the measured attenuation is −50 decibels as predicted via simulation. The correlation between the measured and simulated results shows that bandstop filter 100 serves to illustrate real-world functionality.

It should be further noted that bandstop filter 100 acts as a high pass filter, preventing low frequency signals. As shown by the of graph 400 indicated by dashed ellipse 414, the low frequency band, up to about 1 GHz, is dramatically attenuated. This high pass filtering is a direct result of the use of capacitors 204 and 108 as shown in FIG. 2.

Further, the use of capacitors for the input port, including the bandpass filter portion, decreases the real estate of the absorptive bandstop filter of the present invention as compared to the conventional absorptive bandstop filters discussed above with reference to U.S. Pat. No. 7,323,955 to Jachowski and U.S. Pat. No. 8,981,873 to Zhang et al.

The phase change in a signal used to achieve attenuation will now be described with additional reference to FIG. 5.

Figure 5:
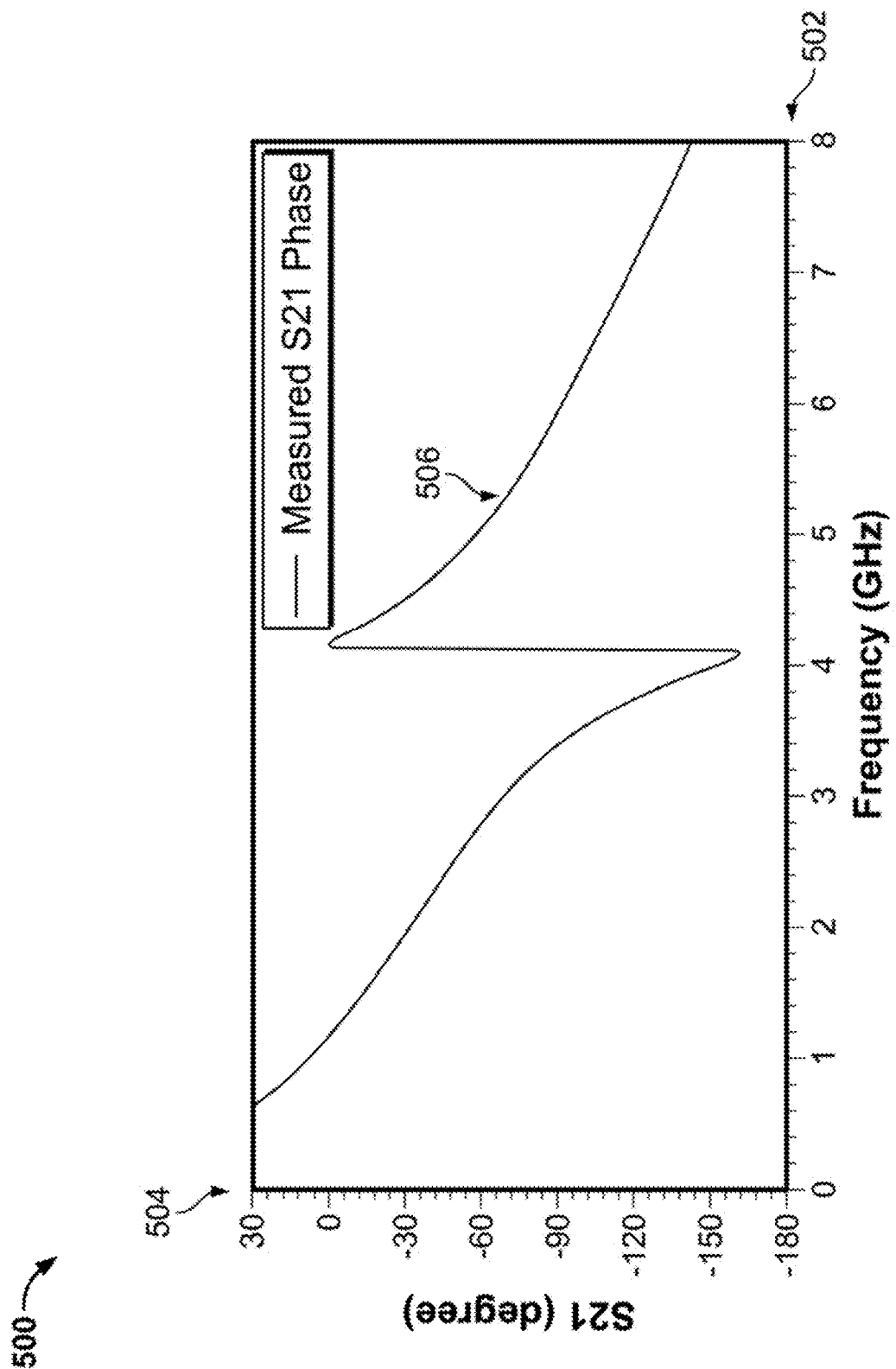
FIG. 5 illustrates a graph of the measured phase change obtained by a bandstop filter in accordance with aspects of the present invention.

FIG. 5 illustrates a graph 500 of the measured phase change bandstop filter 100.

As illustrated in the figure, graph 500 includes an X-Axis 502, a Y-Axis 504, a line 506, and a line 508.

X-Axis 502 represents frequency in GHz. Y-Axis 504 represents signal phase in degrees. Line 506 represents the phase of signal 130 of FIG. 1.

In operation, referring back to FIG. 1, bandstop filter 100 uses destructive interference to achieve attenuation of input signal 124 within an attenuation frequency band. Signal 126 is provided to output port 104, and signal 130 is also provided to output port 104 with a delay in the attenuation frequency band. When signal 126 and signal 130 are received by output port 104, they are combined to create output signal 132. When combined, the phase change between signal 126 and signal 130 creates destructive interference, leading to a cancellation in the signal.

Referring back to FIG. 5, signal 130 experiences a 180° phase change around 4.1 GHz as shown by line 506. This phase change is what will lead to destructive interference between signal 126 and signal 130 of FIG. 1 when they are combined at output port 104 of FIG. 1.

In previous example embodiments, the impedance values of series bandpass resonator 106, capacitor 108, capacitor 110, and bandstop resonator 112 are fixed during the operation of bandstop filter 100. In some example embodiments, the impedance values of series bandpass resonator 106, capacitor 108, capacitor 110, and bandstop resonator 112 may be tunable. The operation of a bandstop filter with tunable impedance elements will now be described with reference to FIG. 4.

Figure 6:
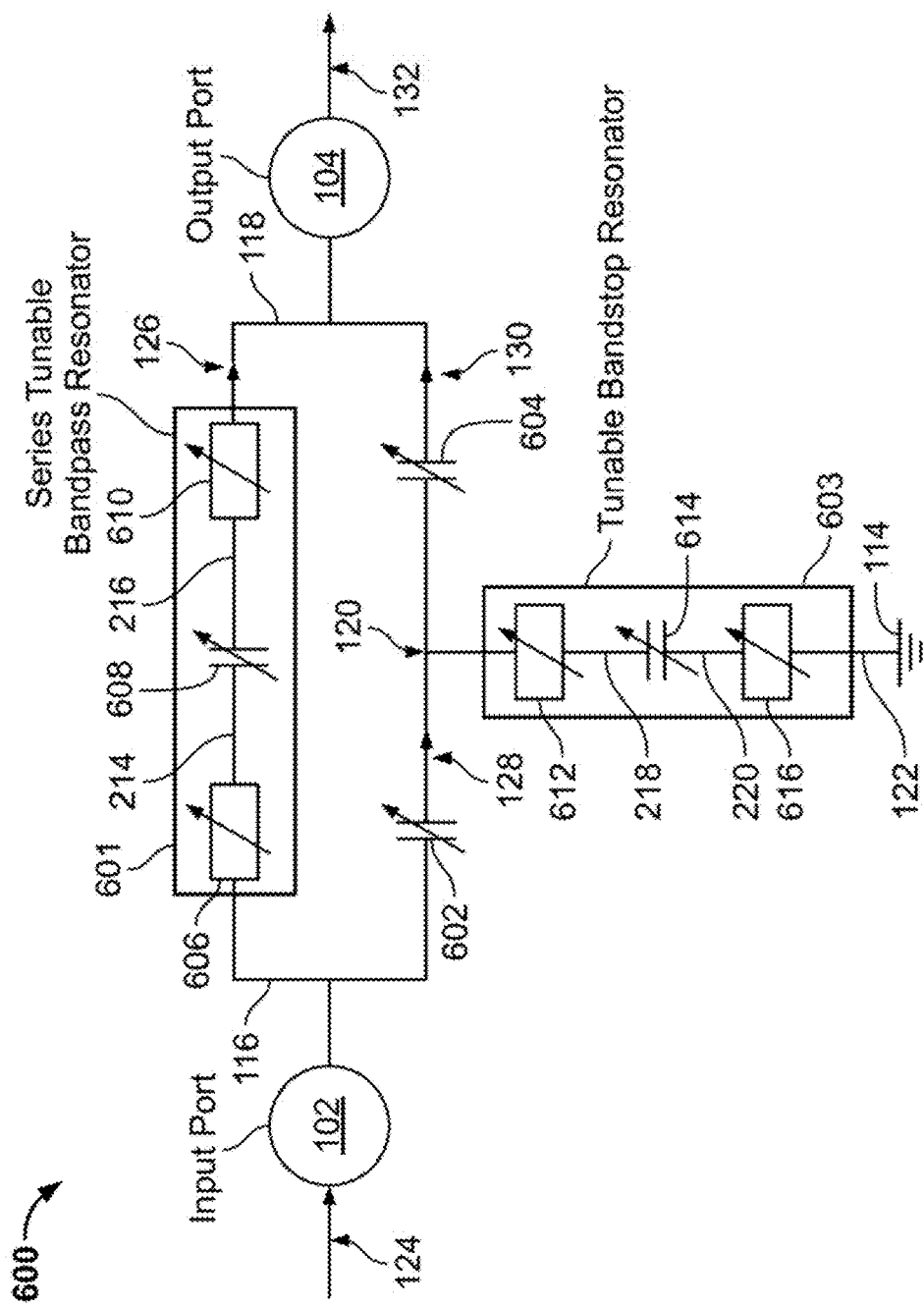
FIG. 6 illustrates a block diagram of a bandstop filter with tunable components in accordance with aspects of the present invention.

FIG. 6 illustrates a bandstop filter 600 with tunable impedance elements.

As illustrated in the figure, bandstop filter 600 includes input port 102, output port 104, a series tunable bandpass resonator 601, a tunable capacitor 602, a tunable capacitor 604, a tunable bandstop resonator 603, and ground 114.

Series tunable bandpass resonator 601 additionally includes a tunable impedance element 606, a tunable bandpass capacitor 608, and a tunable impedance element 610. Tunable bandstop resonator 603 additionally includes a tunable impedance element 612, a tunable bandstop capacitor 614, and a tunable impedance element 616.

The operation of bandstop filter 600 are similar to that of bandstop filter 100 in FIGS. 1-2, except that now the impedance of each impedance component is tunable. It should be noted that in other embodiments, the impedance of any one impedance element, or combination thereof of the impedance elements, may be tunable.

In bandstop filter 100 of FIG. 1, the impedance of each of the impedance components was fixed, which is a suitable if the goal is to attenuate a specific frequency band. On the contrary, bandstop filter 600 is able to attenuate multiple different frequencies, for example at 3.0 GHz and at 5.0 GHz. More specifically, by using components that are tunable, the inductance, capacitance, and resistance values may be varied such that bandstop filter 600 may attenuate either input signal as desired.

Once a specific frequency is determined to be attenuated, the impedance values of series tunable bandpass resonator 601, tunable capacitor 602, tunable capacitor 604 and tunable bandstop resonator 603 may be determined via equations (1)-(3) discussed above. The capacitances of tunable capacitor 602 and tunable capacitor 604 must also be chosen to provide a 180° phase shift between the signal through series tunable bandpass resonator 601 and the signal through tunable bandstop resonator 603.

Thereafter, if a different frequency is determined to be attenuated, the impedance values of series tunable bandpass resonator 601, tunable capacitor 602, tunable capacitor 604 and tunable bandstop resonator 603 may be newly determined, again via equations (1)-(3) discussed above. The capacitances of tunable capacitor 602 and tunable capacitor 604 must also be again chosen to provide a 180° phase shift between the signal through series tunable bandpass resonator 601 and the signal through tunable bandstop resonator 603.

In summary, one problem with conventional bandstop filters is that they are reflection type filters. Reflection is used to reject an unwanted portion of a signal back towards its input. Using reflection to reject unwanted portions of a signal may lead to self-mixing, which is undesirable due to its tendency to degrade an input signal.

A problem with conventional absorptive bandstop filters is that they include inductors at the input ports. Such a design constraint makes the conventional bandstop filters prohibitively large at higher RF frequencies.

The present invention uses a system and method for creating an absorptive bandstop filter to achieve signal attenuation. The bandstop filter uses resonators to create two signals with a phase shift within the attenuation band of a signal. The phase shift between the two signals cancel each other out, allowing a high amount of attenuation to be achieved by using only low order resonators.

The foregoing description of various preferred embodiments have been presented for purposes of illustration and description. It is not intended to be exhaustive or to limit the invention to the precise forms disclosed, and obviously, many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A bandstop filter comprising:
   an input port operable to receive an oscillating signal within a frequency band;
   an output port;
   a series bandpass resonator in electrical connection with said input port and said output port;
   a first capacitor electrically connected with said input port and said series bandpass resonator;
   a bandstop resonator electrically connected with said first capacitor and ground; and
   a second capacitor electrically connected with said bandstop resonator and said output port,
   wherein said series bandpass resonator comprises a first bandpass impedance element, a bandpass capacitor and a second bandpass impedance element arranged in series between said input port and said output port,
   wherein said bandstop resonator comprises a first bandstop impedance element, a bandstop capacitor and a second bandstop impedance element arranged in series between said first capacitor and ground,
   wherein said series bandpass resonator comprises a bandpass resonator impedance magnitude and a bandpass impedance phase,
   wherein the combination of said first capacitor, said bandstop resonator and said second capacitor comprises a bandstop impedance magnitude and a bandstop impedance phase,
   wherein the bandpass resonator impedance magnitude is substantially equal to the bandstop impedance magnitude,
   wherein the bandpass resonator impedance phase is substantially 180° out of phase with the bandstop impedance phase, and
   wherein said series bandpass resonator, said first capacitor, said bandstop resonator and said second capacitor operate as a band stop for a predetermined frequency within the frequency band.

2. The bandstop filter of claim 1,
wherein said first capacitor comprises a first tunable capacitor,
wherein said second capacitor comprises a second tunable capacitor, and
wherein a capacitance of said first tunable capacitor and a capacitance of said second tunable capacitor are set such that the bandpass resonator impedance phase is substantially 180° out of phase with the bandstop impedance phase.

3. The bandstop filter of claim 2, wherein said first bandpass impedance element comprises a first adjustable impedance element.

4. The bandstop filter of claim 3, wherein said bandpass capacitor comprises an adjustable capacitance bandpass capacitor.

5. The bandstop filter of claim 4, wherein said adjustable capacitance bandpass capacitor comprises a bandpass varactor.

6. The bandstop filter of claim 5, wherein said second bandpass impedance element comprises a second adjustable impedance element.

7. The bandstop filter of claim 2, wherein said first bandstop impedance element comprises a first adjustable impedance element.

8. The bandstop filter of claim 7, wherein said bandstop capacitor comprises an adjustable capacitance bandstop capacitor.

9. The bandstop filter of claim 8, wherein said adjustable capacitance bandstop capacitor comprises a bandstop varactor.

10. The bandstop filter of claim 9, wherein said second bandstop impedance element comprises a second adjustable impedance element.

11. A method of filtering a signal, said method comprising:
receiving, at an input port, an oscillating signal within a frequency band;
providing the received oscillating signal to a series bandpass resonator in electrical connection with the input port and an output port;
providing the received oscillating signal additionally to a first capacitor electrically connected with the input port;
providing a capacitor-filtered oscillating signal to a bandstop resonator electrically connected with the first capacitor and ground; and
providing a bandstop-filtered oscillating signal to a second capacitor electrically connected with the bandstop resonator and the output port,
wherein the series bandpass resonator comprises a first bandpass impedance element, a bandpass capacitor and a second bandpass impedance element arranged in series between the input port and the output port,
wherein the bandstop resonator comprises a first bandstop impedance element, a bandstop capacitor and a second bandstop impedance element arranged in series between the first capacitor and ground,
wherein the series bandpass resonator comprises a bandpass resonator impedance magnitude and a bandpass impedance phase,
wherein the combination of the first capacitor, the bandstop resonator and the second capacitor comprises a bandstop impedance magnitude and a bandstop impedance phase,
wherein the bandpass resonator impedance magnitude is substantially equal to the bandstop impedance magnitude,
wherein the bandpass resonator impedance phase is substantially 180° out of phase with the bandstop impedance phase, and
wherein the series bandpass resonator, the first capacitor, the bandstop resonator and the second capacitor operate as band stop for a predetermined frequency within the frequency band.

12. The method of claim 11,
wherein said providing the received oscillating signal additionally to the first capacitor electrically connected with the input port comprises providing the received oscillating signal additionally to a first tunable capacitor,
wherein providing the bandstop-filtered oscillating signal to the second capacitor electrically connected with the bandstop resonator and the output port comprises providing the bandstop-filtered oscillating signal to a second tunable capacitor, and
wherein a capacitance of the first tunable capacitor and a capacitance of the second tunable capacitor are set such that the bandpass resonator impedance phase is substantially 180° out of phase with the bandstop impedance phase.

13. The method of claim 12, wherein the first bandpass impedance element comprises a first adjustable impedance element.

14. The method of claim 13, wherein the bandpass capacitor comprises an adjustable capacitance bandpass capacitor.

15. The method of claim 14, wherein the adjustable capacitance bandpass capacitor comprises a bandpass varactor.

16. The method of claim 15, wherein the second bandpass impedance element comprises a second adjustable impedance element.

17. The method of claim 12, wherein the first bandstop impedance element comprises a first adjustable impedance element.

18. The method of claim 17, wherein the bandstop capacitor comprises an adjustable capacitance bandstop capacitor.

19. The method of claim 18, wherein the adjustable capacitance bandstop capacitor comprises a bandstop varactor.

20. A bandstop filter comprising:
an input port operable to receive an oscillating signal within a frequency band;
an output port;
a series bandpass resonator in electrical connection with said input port and said output port;
a first capacitor electrically connected with said input port and said series bandpass resonator;
a bandstop resonator electrically connected with said first capacitor and ground; and
a second capacitor electrically connected with said bandstop resonator and said output port,
wherein said series bandpass resonator comprises a first bandpass impedance element, a bandpass varactor and a second bandpass impedance element arranged in series between said input port and said output port,
wherein said bandstop resonator comprises a first bandstop impedance element, a bandstop varactor and a second bandstop impedance element arranged in series between said first capacitor and ground, wherein said series bandpass resonator comprises a bandpass resonator impedance magnitude and a bandpass impedance phase, wherein the combination of said first capacitor, said bandstop resonator and said second capacitor comprises a bandstop impedance magnitude and a bandstop impedance phase, wherein the bandpass resonator impedance magnitude is substantially equal to the bandstop impedance magnitude, wherein the bandpass resonator impedance phase is substantially 180° out of phase with the bandstop impedance phase, and wherein said series bandpass resonator, said first capacitor, said bandstop resonator and said second capacitor operate as band stop for a predetermined frequency within the frequency band.

* * * * *